United States Patent
Li et al.

(10) Patent No.: US 7,341,907 B2
(45) Date of Patent: Mar. 11, 2008

(54) SINGLE WAFER THERMAL CVD PROCESSES FOR HEMISPHERICAL GRAINED SILICON AND NANO-CRYSTALLINE GRAIN-SIZED POLYSILICON

(75) Inventors: Ming Li, Cupertino, CA (US); Kevin Cunningham, Palo Alto, CA (US); Sheeba Panayil, Santa Clara, CA (US); Guangcai Xing, Fremont, CA (US); R. Suryanarayanan Iyer, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 374 days.

(21) Appl. No.: 11/099,081

(22) Filed: Apr. 5, 2005

(65) Prior Publication Data

US 2006/0223333 A1 Oct. 5, 2006

(51) Int. Cl.
*H01L 21/8242* (2006.01)

(52) U.S. Cl. .................. 438/240; 438/97; 438/640; 257/E21.17; 257/E21.412

(58) Field of Classification Search .................. 438/240
See application file for complete search history.

(56) References Cited

U.S. PATENT DOCUMENTS

| | | |
|---|---|---|
| 5,658,381 A | 8/1997 | Thakur et al. |
| 5,663,090 A | 9/1997 | Dennison et al. |
| 5,753,559 A | 5/1998 | Yew et al. |
| 5,759,262 A | 6/1998 | Weimer et al. |
| 5,798,280 A | 8/1998 | Mathews et al. |
| 5,960,281 A | 9/1999 | Nam et al. |
| 6,060,355 A | 5/2000 | Batra et al. |
| 6,413,833 B2 | 7/2002 | Yamamoto |
| 2001/0009284 A1 | 7/2001 | Yang |
| 2001/0009808 A1 | 7/2001 | Ping et al. |
| 2002/0132101 A1* | 9/2002 | Fonash et al. ........... 428/304.4 |
| 2002/0173127 A1 | 11/2002 | Wang et al. |
| 2003/0047734 A1 | 3/2003 | Fu et al. |
| 2003/0124818 A1 | 7/2003 | Luo et al. |
| 2004/0063301 A1 | 4/2004 | Fu et al. |
| 2004/0203233 A1* | 10/2004 | Kang et al. ................. 438/686 |
| 2006/0258124 A1* | 11/2006 | Singh et al. ................. 438/479 |

OTHER PUBLICATIONS

T.I. Kamins, et al., "Structure of Chemically Deposited Polycrystalline-Silicon Films" Thin Solid Films vol. 16 (1973) p. 147-165.
Akira Sakai, et al., "Novel Seeding Method for the Growth of Polycrystalline Si Films with Hemispherical Grains" Appl. Phys. Lett., vol. 61(2), Jul. 13, 1992, p. 159-161.

* cited by examiner

*Primary Examiner*—Michael Lebentritt
*Assistant Examiner*—Abdulfattah Mustapha
(74) *Attorney, Agent, or Firm*—Patterson & Sheridan, LLP

(57) ABSTRACT

Methods for depositing hemispherical grained silicon layers and nanocrystalline grain-sized polysilicon layers are provided. The hemispherical grained silicon layers and nanocrystalline grain-sized polysilicon layers are deposited in single substrate chemical vapor deposition chambers. The hemispherical grained silicon layers and nanocrystalline grain-sized polysilicon layers may be used as electrode layers in semiconductor devices. In one aspect, a two step deposition process is provided to form a nanocrystalline grain-sized polysilicon layer with a reduced roughness.

20 Claims, 5 Drawing Sheets

SINGLE WAFER THERMAL CVD PROCESSES FOR HEMISPHERICAL GRAINED SILICON AND NANO-CRYSTALLINE GRAIN-SIZED POLYSILICON

BACKGROUND OF THE INVENTION

1. Field of the Invention

Embodiments of the present invention generally relate to a method of forming a silicon layer. More particularly, embodiments of the invention relate to methods of forming hemispherical grained silicon layers and nanocrystalline grain-sized polysilicon layers for electrodes in semiconductor devices.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. As semiconductor device sizes decrease, new methods of depositing or forming the materials of the components of semiconductor devices are required to provide components having the appropriate characteristics to maintain or enhance the performance of the devices compared to prior, larger devices.

Many methods of depositing silicon or silicon-containing layers have been developed as silicon is used extensively in semiconductor device fabrication. For example, methods of depositing silicon layers having different grain sizes have been developed to form silicon layers suitable for different uses. In one example, methods of forming hemispherical grained silicon (HSG) for a bottom electrode of a DRAM device have been developed. Hemispherical grained silicon has a textured surface that provides a significantly larger surface area than a smooth surface and thus provides an increased capacitance for a DRAM capacitor containing a hemispherical grained silicon electrode.

Prior methods of forming hemispherical grained silicon have typically included depositing an amorphous silicon layer and then performing a time consuming annealing step to convert the amorphous silicon layer into a hemispherical grained silicon layer. The prior methods have also required a narrow range of process conditions that can be difficult to achieve.

Methods of forming silicon layers for electrodes in other devices have also been developed. For example, a method of forming a silicon bi-layer for gate electrodes has been developed. This method includes depositing a lower polysilicon layer having a random grain structure followed by an upper polysilicon layer having a columnar grain structure. The columnar grain structure provides relatively few grain boundaries in the silicon bi-layer. It has been observed that a large number, i.e., thousands, of grain boundaries provide enhanced electrical properties, such as increased carrier mobility in a gate structure. However, it has proven challenging to develop methods of forming a polysilicon layer that has many grain boundaries, uniform grain structure and size, a low film roughness such that subsequently deposited layers adhere well to the polysilicon layer, and that maintains its grain size and structure after subsequent semiconductor processing steps.

Thus, there remains a need for methods of forming silicon layers that may be used as electrodes in semiconductor devices.

SUMMARY OF THE INVENTION

Embodiments of the invention generally provide a method of depositing silicon or doped silicon layers on a substrate. In one embodiment, a method of forming a hemispherical grained silicon layer on a substrate comprises introducing a silicon-containing precursor and a carrier gas into a single substrate chemical vapor deposition chamber, and thermally decomposing the silicon-containing precursor to deposit a hemispherical grained silicon layer on a substrate on a substrate support in the chamber. The substrate support is maintained at a temperature between about 670° C. and about 710° C., and the chamber is maintained at a pressure between about 100 Torr and about 350 Torr during the deposition. The carrier gas may comprise nitrogen or nitrogen and hydrogen. The hemispherical grained silicon layer has a refractive index of between about 3.0 and about 3.7 and a grain size between about 450 Å and about 700 Å.

In other embodiments, a method of forming a nanocrystalline grain-sized polysilicon layer is provided. In one embodiment, the method comprises introducing a silicon-containing precursor and a carrier gas into a single substrate chemical vapor deposition chamber, and thermally decomposing the silicon-containing precursor to deposit a nanocrystalline grain-sized polysilicon layer on a substrate on a substrate support in the chamber. The substrate support is maintained at a temperature between about 700° C. and about 730° C., and the chamber is maintained at a pressure between about 150 Torr and about 350 Torr during the deposition. The nanocrystalline grain-sized polysilicon layer is annealed after it is deposited. The nanocrystalline grain-sized polysilicon layer may be deposited in a two part process wherein the nanocrystalline grain-sized polysilicon layer is deposited at a first deposition rate and then deposited at a second deposition less than the first deposition rate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide methods of forming silicon layers that may be used as electrode layers in semiconductor devices. In one embodiment, a method of forming a hemispherical grained silicon layer is provided. In another embodiment, a method of forming a nanocrystalline grain-sized polysilicon layer is provided.

The processing conditions provided in the embodiments below are provided with respect to a 300 mm substrate. It is recognized that the processing conditions may be modified according to the substrate size.

Figure 1:
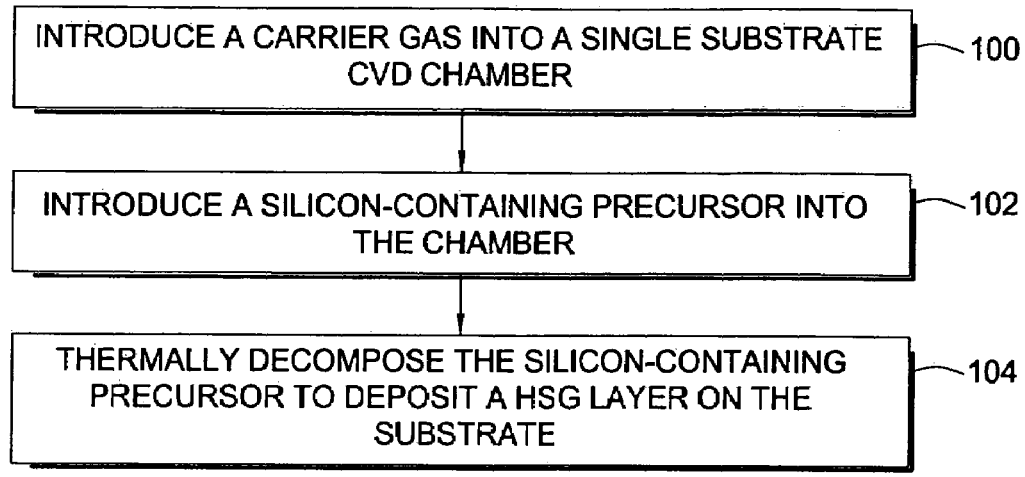
FIG. 1 is a flow chart depicting one embodiment of the invention.

An embodiment of a method of forming a hemispherical grained silicon layer will be described below with respect to FIG. 1. A carrier gas is introduced into a single substrate chemical vapor deposition (CVD) chamber having a substrate disposed on a substrate support in the chamber for a period of time to stabilize the chamber pressure, as shown in step 100. The substrate may comprise a silicon, silicon oxide, or silicon nitride layer, for example. The carrier gas may comprise nitrogen ($N_2$) or nitrogen ($N_2$) diluted with hydrogen ($H_2$), such as about 20% to about 100% hydrogen ($H_2$). The carrier gas may be introduced at a flow rate between about 3000 sccm and about 20000 sccm.

An example of a single substrate chemical vapor deposition chamber that may be used is a POLYgen™ chamber, available from Applied Materials, Inc. of Santa Clara, Calif. However, other deposition chambers, such as other chemical vapor deposition chambers including a showerhead above a substrate support, may be used. The substrate support is heated to a temperature between about 670° C. and about 710° C. while the chamber pressure is stabilized at a pressure between about 100 Torr and about 350 Torr. Typically, the substrate temperature is about 20° C. to about 30° C. less than the temperature of the substrate support. After the chamber pressure is stabilized, a silicon-containing precursor is introduced into the chamber, as shown at step 102. Examples of silicon-containing precursors that may be used include silane ($SiH_4$) and disilane ($Si_2H_6$). The silicon-containing precursor may be introduced into the chamber at a flow rate between about 50 sccm and about 400 sccm while the flow of carrier gas into the chamber is maintained at a flow rate between about 3000 sccm and about 20000 sccm.

The silicon-containing precursor and the carrier gas may be introduced into the chamber through a showerhead above the substrate support. The silicon-containing precursor is thermally decomposed into silicon and hydrogen within the chamber, i.e., in the absence of a plasma or photon enhancement, and a hemispherical grained silicon layer is deposited on the substrate while the substrate support is maintained at a temperature between about 670° C. and about 710° C. and the chamber is maintained at a pressure between about 100 Torr and about 350 Torr, as shown in step 104. The substrate support may be maintained at a substantially constant temperature during the deposition of the hemispherical grained silicon layer. The un-reacted silicon-containing precursor and carrier gas (e.g., nitrogen or nitrogen and hydrogen) are evacuated from the chamber.

Figure 2:
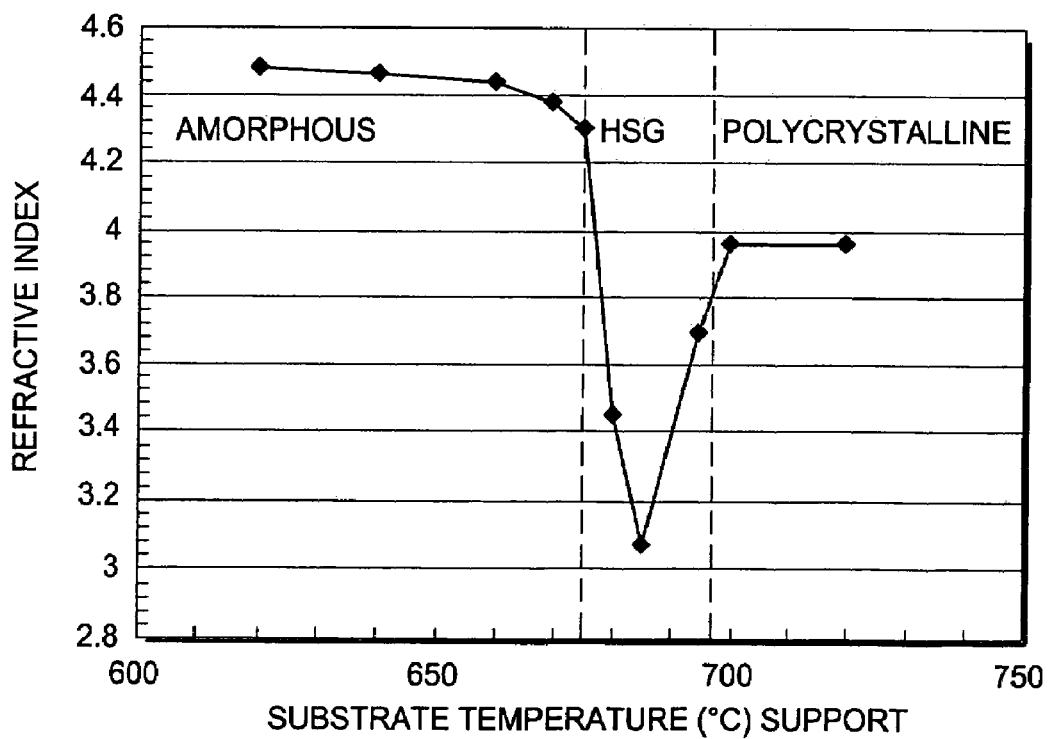
FIG. 2 is a graph showing the refractive index vs. substrate support temperature of layers deposited according to embodiments of the invention.

Typically, the deposited hemispherical grained silicon layer has a refractive index between about 3.0 and 3.7. The low refractive index is a result of the large number of voids formed between the hemispherical grains of silicon in the HSG layer. As shown in FIG. 2, a deposition process using silane and nitrogen at a substrate support temperature of approximately 670° C. to 710° C. provided a hemispherical grained silicon layer having a refractive index of approximately 3.0 to 3.7, while a substrate support temperature of less than 670° C. provide an amorphous silicon film having a refractive index of about 4.4 to about 4.5, and a substrate support temperature of greater than 710° C. provided a polycrystalline silicon film having a refractive index of about 3.9 to about 4.0. Thus, a substrate support temperature of between about 670° C. and about 710° C. corresponds to the phase transition temperature between an amorphous silicon layer and a polycrystalline silicon layer.

It was also found that the use of hydrogen-diluted nitrogen rather than nitrogen as the carrier gas affected the process conditions needed to obtain a hemispherical grained silicon layer. For example, using pure nitrogen as the carrier, process conditions comprising a substrate support temperature of about 675° C. to about 700° C., a silane flow rate of about 50 sccm to about 300 sccm, and a chamber pressure of about 100 Torr to about 350 Torr are preferred, while process conditions comprising a substrate support temperature of about 680° C. to about 710° C. are preferred when using 14% hydrogen in nitrogen as the carrier gas.

While a substrate support temperature range of 670° C. to about 710° C. is preferred for depositing hemispherical grained silicon layers using a carrier gas comprising nitrogen and up to about 14% hydrogen according to embodiments of the invention, it is recognized that hemispherical grained silicon layers may be deposited at higher substrate support temperatures if a higher concentration of hydrogen is used in the carrier gas. For example, using a carrier gas of 3000 sccm of hydrogen and 5000 sccm nitrogen (37.5% hydrogen), a hemispherical grained silicon layer may be deposited at a substrate support temperature of up to 715° C. A hemispherical grained silicon layer may be deposited at a substrate support temperature of up to 720° C. using a carrier gas of 4000 sccm of hydrogen and 4000 sccm nitrogen (50% hydrogen).

It was further found that the grain size of a hemispherical grained silicon layer can be controlled by adding hydrogen to the carrier gas. For example, an average grain size of 450 Å was obtained when using nitrogen as the carrier gas, while an average grain size of 700 Å was obtained when using 14% hydrogen in nitrogen as the carrier gas.

Figure 3:
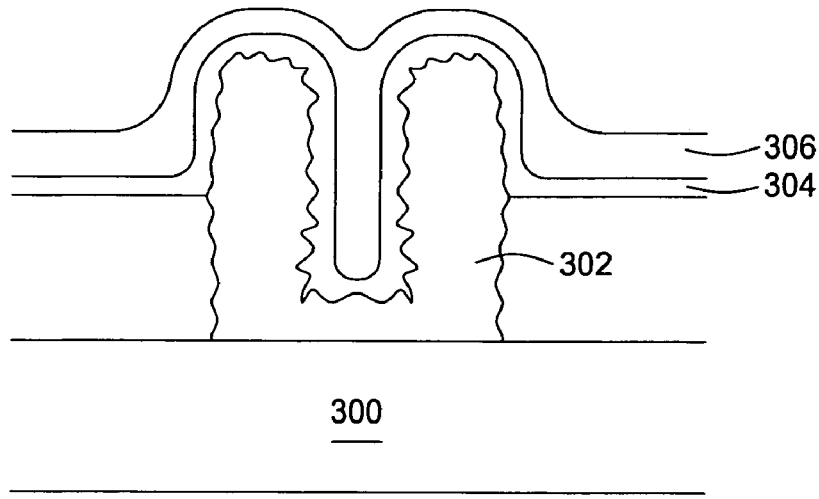
FIG. 3 is a cross-sectional view of a structure including a hemispherical grained silicon layer according to an embodiment of the invention.

Typically, after the hemispherical grained silicon layer is deposited, it is doped with an n- or p-type dopant. For example, the hemispherical grained silicon layer may be doped with phosphorus, boron, or arsenic. The doped hemispherical grained silicon layer may be used as an electrode, such as a bottom electrode in a DRAM device. FIG. 3 shows an example of a doped hemispherical grained silicon layer 302 that is deposited on a substrate 300 of a DRAM device. The doped hemispherical grained silicon layer 302 serves as a bottom electrode. A dielectric layer 304 is formed over the doped hemispherical grained silicon layer 302, and a doped polysilicon layer 306 over the dielectric layer 304 serves as an upper electrode.

An example of a method of doping a hemispherical grained silicon layer with phosphorus is provided below. After the hemispherical grained silicon layer is deposited on a substrate, the substrate may be removed from the chamber briefly. For example, the substrate may be removed from the chamber and exposed to atmosphere briefly before being returned to the chamber. A thin, native oxide may form on the substrate while the substrate is outside of the chamber. The thin, native oxide confines the arrangement of the silicon atoms such that the hemispherical grained structure of the silicon layer is retained during subsequent processing. The substrate is then returned to the chamber, which is evacuated to a pressure between about 50 Torr and about 330 Torr. The substrate is then exposed to a flow of 1% phosphine diluted with hydrogen at a flow rate of between about 50 sccm and about 300 sccm for about 5 to about 30 minutes, such as about 10 minutes. The phosphine decomposes, and the hemispherical grained silicon layer is doped with phosphorus. The substrate support temperature during the doping may be between about 680° C. and about 700° C.

Embodiments of the invention are further described by the following example which is not intended to limit the scope of the claimed invention.

EXAMPLE

A 300 mm substrate having a gate oxide layer thereon was introduced into a POLYgen™ chamber. Nitrogen carrier gas was introduced into the chamber to stabilize the chamber pressure, and the substrate support was heated to a temperature of 700° C. Disilane gas was introduced into the chamber at a flow rate of 94 sccm while the nitrogen carrier gas was flowed into the chamber at a flow rate of 12000 sccm and hydrogen gas was flowed into the chamber at a flow rate of 6000 sccm for a period of about 40 seconds. The disilane was thermally decomposed, and a layer of hemispherical grained silicon having a thickness of about 1400 Å was deposited on the substrate. The hemispherical grained structure of the layer was confirmed by SEM, and the average grain size of the layer was about 350 Å. The hemispherical grained silicon layer had a refractive index of 3.15.

SEMs of layers deposited according to embodiments of the invention indicate that the layers as deposited have a hemispherical grained structure. Thus, unlike prior methods of forming hemispherical grained silicon layers, a separate annealing step is not required to form a hemispherical grained structure after the layer is deposited.

An embodiment of a method of forming a nanocrystalline grain-sized polysilicon layer will now be described with respect to FIG. 4. A carrier gas is introduced into a single substrate chemical vapor deposition chamber, such as a POLYgen™ chamber, having a substrate disposed on a substrate support in the chamber for a period of time to stabilize the chamber pressure, as shown in step 400. The chamber is evacuated to a pressure between about 50 and about 350 Torr, and the substrate support is heated to a temperature between about 700° C. and about 730° C., such as between about 710° C. and about 720° C. The substrate may comprise a silicon, silicon oxide, or silicon nitride layer, for example. The carrier gas may comprise an inert gas, such as nitrogen ($N_2$), argon (Ar), helium (He) or combinations thereof. As defined herein, an inert gas is a gas which is not consumed by or which does not participate in the reaction used to deposit the layer and does not interact with the chamber components during the layer deposition. The carrier gas may also include hydrogen ($H_2$). For example, the carrier gas may comprise an inert gas diluted with about 0% to about 100% hydrogen ($H_2$), such as 20% to about 100% hydrogen ($H_2$), preferably diluted with about 20% to about 40% hydrogen ($H_2$). In one aspect, the carrier gas has a sufficient hydrogen ($H_2$)/inert gas concentration ratio such that the subsequently deposited polysilicon layer has a predominantly <111> crystal orientation rather than a <220> crystal orientation. Additionally, the carrier gas preferably has a sufficient hydrogen ($H_2$)/inert gas concentration ratio such that the subsequently deposited polysilicon layer has a random grain structure with an average grain size of about 70 Å to about 120 Å according to X-ray diffraction measurements.

The carrier gas may be introduced into the chamber at a flow rate between about 2 slm and about 12 slm. The carrier gas is introduced into the chamber through a showerhead in the lid of the chamber above the substrate support in the chamber. The carrier gas may also be introduced into a lower portion of the chamber below the substrate support in order to help prevent the polysilicon layer from depositing on components in the lower portion of the chamber.

After the carrier gas flow, chamber pressure, and substrate support temperature are stabilized, a silicon-containing precursor is introduced into the chamber, as shown at step 402, while the flow of the carrier gas is maintained. Preferably, the silicon-containing precursor has an activation energy of less than about 1 eV at a substrate support temperature of less than about 750° C. The low activation energy, i.e., less than about 1 eV, results in a layer deposition rate that is not highly dependent on the substrate temperature, and thus, is not highly sensitive to temperature fluctuations or variations across the substrate. Examples of silicon-containing precursors that may be used include disilane ($Si_2H_6$) and trisilane ($Si_3H_8$). Preferably, the silicon-containing precursor is disilane ($Si_2H_6$). The silicon-containing precursor may be introduced into the chamber at a flow rate between about 30 sccm and about 150 sccm, preferably between about 40 sccm and about 90 sccm while the flow of carrier gas into the chamber is maintained at a flow rate between about 2 slm and about 15 slm and the chamber pressure is maintained between about 150 and about 350 Torr, and the substrate support is maintained at a temperature between about 700° C. and about 730° C. Typically, the substrate temperature is about 20° C. to about 30° C. less than the temperature of the substrate support. In one embodiment, the silicon-containing precursor is added to the flow of the carrier gas and introduced into the chamber with the carrier gas.

The silicon-containing precursor is thermally decomposed, i.e., in the absence of a plasma or photon enhancement, into silicon and hydrogen, and a nanocrystalline grain-sized polysilicon layer is deposited on the substrate, as shown in step 404. Since hydrogen is a by-product of the thermal decomposition of the silicon-containing precursor, the decomposition rate of the silicon-containing precursor may be decreased by adding hydrogen ($H_2$) to the carrier gas, which in turn enhances the formation of a polysilicon layer having small and random grains.

As discussed above with respect to embodiments of depositing a hemispherical grained silicon layer, it was also found that the use of hydrogen-diluted nitrogen rather than nitrogen as the carrier gas affected the process conditions needed to obtain a nanocrystalline grain-sized polysilicon layer. For example, with a 50% hydrogen, 50% nitrogen carrier gas, a substrate support temperature of at least about 720° C. is preferred to deposit a nanocrystalline grain-sized polysilicon layer, while with pure nitrogen as a carrier gas, a substrate support temperature of at least about 700° C. may be used to deposit a nanocrystalline grain-sized polysilicon layer. In a preferred embodiment, a substrate support temperature of between about 700° C. and about 730° C. is used with a carrier gas comprising nitrogen and between about 0% to about 50% hydrogen.

Figure 5:
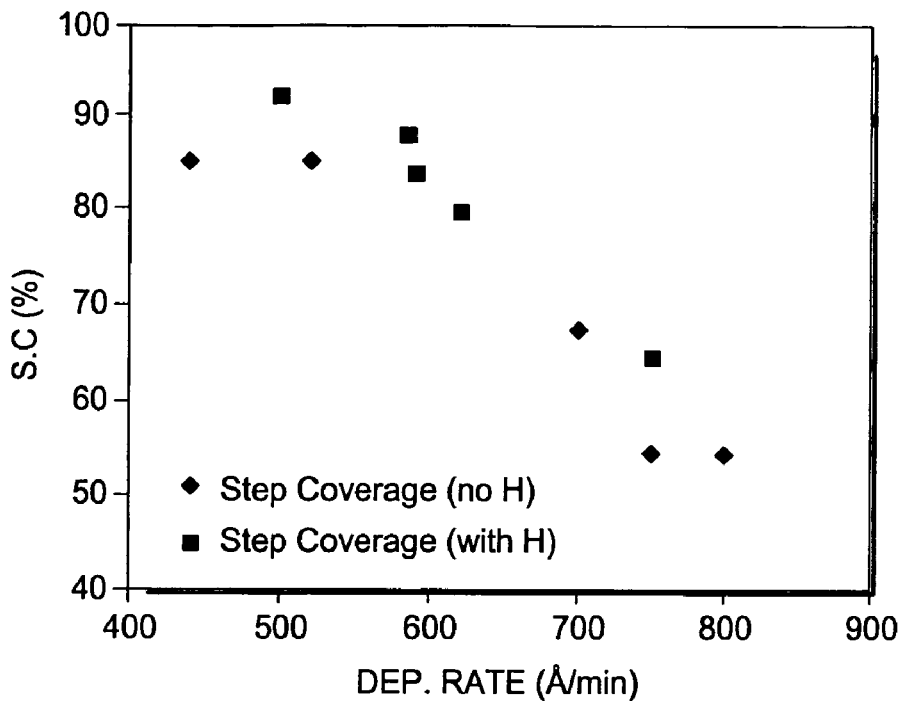
FIG. 5 is a graph showing the step coverage vs. deposition rate of layers deposited according to embodiments of the invention.

It was also observed that adding hydrogen ($H_2$) to the carrier gas affects the step coverage of the nanocrystalline grain-sized polysilicon layer on a substrate. As shown in FIG. 5, a nanocrystalline grain-sized polysilicon layer deposited using a carrier gas including hydrogen ($H_2$) (22%

$H_2$) had better step coverage than a nanocrystalline grain-sized polysilicon layer deposited using a carrier gas that did not include hydrogen ($H_2$). It was also observed that improved step coverage was obtained at lower deposition rates.

Figure 6:
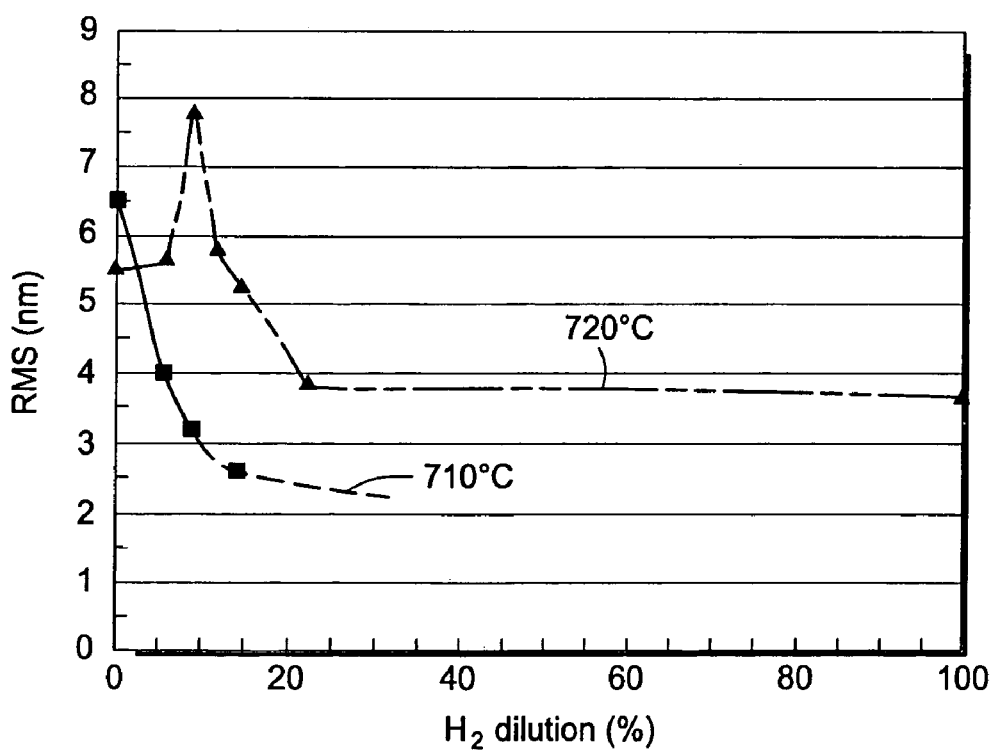
FIG. 6 is a graph showing roughness vs. hydrogen ($H_2$) carrier gas concentration of layers deposited according to embodiments of the invention.

FIG. 6 shows that the concentration of hydrogen ($H_2$) in the carrier gas affects the roughness of the deposited layer. As shown in FIG. 6, polysilicon layers deposited at a substrate support temperatures of 710° C. and 720° C. with at least about 20% $H_2$ in the carrier gas had improved, i.e., reduced, roughness (rms).

The nanocrystalline grain-sized polysilicon layer may be doped by introducing an n- or p-type dopant into the chamber in addition to the silicon-containing precursor. For example, a flow of between about 25 sccm and about 100 sccm of 1% diluted arsine or phosphine may be used to provide an n-type dopant or a flow of between about 25 sccm and about 100 sccm of 1% diluted diborane may be used to provide a p-type dopant.

Figure 7:
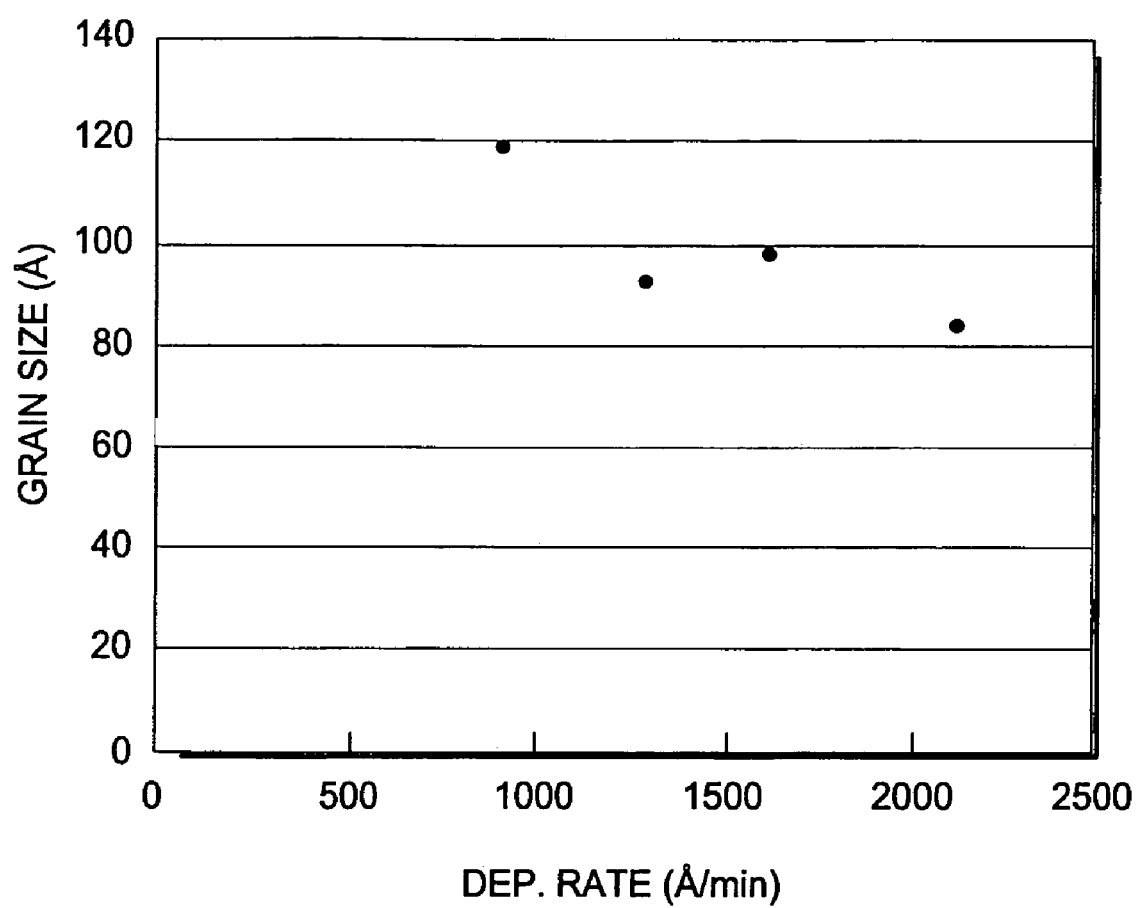
FIG. 7 is a graph showing grain size vs. deposition rate for layers deposited according to embodiments of the invention.

The nanocrystalline grain-sized polysilicon layer may be deposited at a rate between about 1000 Å and about 3000 Å per minute, preferably at a rate between about 1500 Å and about 2500 Å per minute. Such deposition rates are possible because a single substrate chemical vapor deposition chamber is used rather than a batch furnace. High precursor gas flow rates used in the single substrate chemical vapor deposition chamber contribute to the high deposition rates. The high deposition rates enhance the formation of small grains which are preferred as polysilicon layers containing large grains tend to have sharp corners when etched in subsequent processing steps, resulting in a high current leakage. FIG. 7 is a graph that illustrates the relationship between grain size and deposition rate.

The nanocrystalline grain-sized polysilicon layer may be deposited to varying thicknesses, depending on the use of the layer. For example, for use in a gate electrode as a diffusion barrier to prevent subsequently implanted dopants, such as boron, from passing through the electrode into the underlying gate dielectric, the nanocrystalline grain-sized polysilicon layer is deposited to a sufficient thickness, e.g., between about 200 Å and about 2000 Å, to substantially prevent a dopant from diffusing through the layer into the gate dielectric during a subsequent annealing step used to activate the dopants.

In a preferred embodiment, the nanocrystalline grain-sized polysilicon layer is deposited in a two part method. In the first part, a silicon-containing precursor is introduced into a chamber at a flow rate, such as a flow rate between about 80 sccm and about 200 sccm, and thermally decomposed to deposit a nanocrystalline grain-sized polysilicon layer, as described in steps 402 and 404 of FIG. 4. The chamber pressure may be between about 150 Torr and about 350 Torr during the deposition. In the second part, the flow rate of the silicon-containing precursor into the chamber is reduced, such as to a flow rate between about 10 sccm and about 70 sccm, and a second nanocrystalline grain-sized polysilicon layer is deposited on the previously deposited nanocrystalline grain-sized polysilicon layer at a lower deposition rate than the previously deposited nanocrystalline grain-sized polysilicon layer. The chamber pressure may be between about 150 Torr and about 350 Torr during the deposition. Table 1 compares the results of processes in which the nanocrystalline grain-sized polysilicon layer is deposited in a one part method (Process 1) and in which the nanocrystalline grain-sized polysilicon layer is deposited in a two part method (Process 2). Processes 1 and 2 were both performed at a substrate support temperature of 720° C. and a chamber pressure of 275 Torr. The carrier gas for processes 1 and 2 included nitrogen and hydrogen.

TABLE 1

| | Step | $Si_2H_6$ sccm | Dep time sec | Thickness Å | Thickness uniformity % % | R # | Grain Size Å | Roughness Å |
|---|---|---|---|---|---|---|---|---|
| Process 1 | Deposition | 60 | 28.2 | 990 | 1.47 | 0.64 | 88 | 36 |
| Process 2 | Deposition 1 | 90 | 5 | | | | | |
| | Deposition 2 | 40 | 30 | 982 | 1.33 | 0.62 | 86 | 27 |

As shown in Table 1, the two part method for depositing the nanocrystalline grain-sized polysilicon layer provided an improved, lower surface roughness (27 Å vs. 36 Å) than the one part method, as measured by atomic force microscopy. The high deposition rate of the first part of the method provides a first or seed nanocrystalline grain-sized polysilicon layer that has a random grain structure with small grains, while the lower deposition rate of the second part of the method provides a second nanocrystalline grain-sized polysilicon layer that provides a smooth surface for the nanocrystalline grain-sized polysilicon layer comprising the first and second layers. A lower surface roughness is desirable because it provides a smooth surface that enhances the uniform deposition of subsequently deposited layers thereon. A lower surface roughness is also desirable for avoiding lithography or patterning errors caused by layers having non-uniform surfaces. Preferably, the nanocrystalline grain-sized polysilicon layer has a root mean square (rms) roughness of less than about 3 nm. An estimate of the roughness can be obtained by atomic force microscopy (AFM).

An example of a device in which a smooth nanocrystalline grain-sized polysilicon layer is desirable is a gate electrode of a flash memory device, also known as the floating gate. In such a device, the nanocrystalline grain-sized polysilicon layer may be deposited on an oxide gate dielectric, and an oxide nitride oxide layer may be deposited on the smooth nanocrystalline grain-sized polysilicon layer. Another polysilicon layer, also known as the control gate, may be deposited on the oxide nitride oxide layer to complete the gate electrode.

Table 1 also shows that the R-number, which is a measure of randomness, of a nanocrystalline grain-sized polysilicon layer deposited by the two part method is essentially the same as the randomness of a nanocrystalline grain-sized polysilicon layer deposited by the one part method. The R-number is defined as the ratio of the peak full width at half maximum (FWHM) of the <220> divided by the <111> peak in the X-ray diffraction (XRD) spectrum of the layers. For highly random films, the R-number is high. As defined herein, an R-number of >0.65 is required for a layer to be considered random enough to be a nanocrystalline grain-sized polysilicon layer.

Figure 8A:
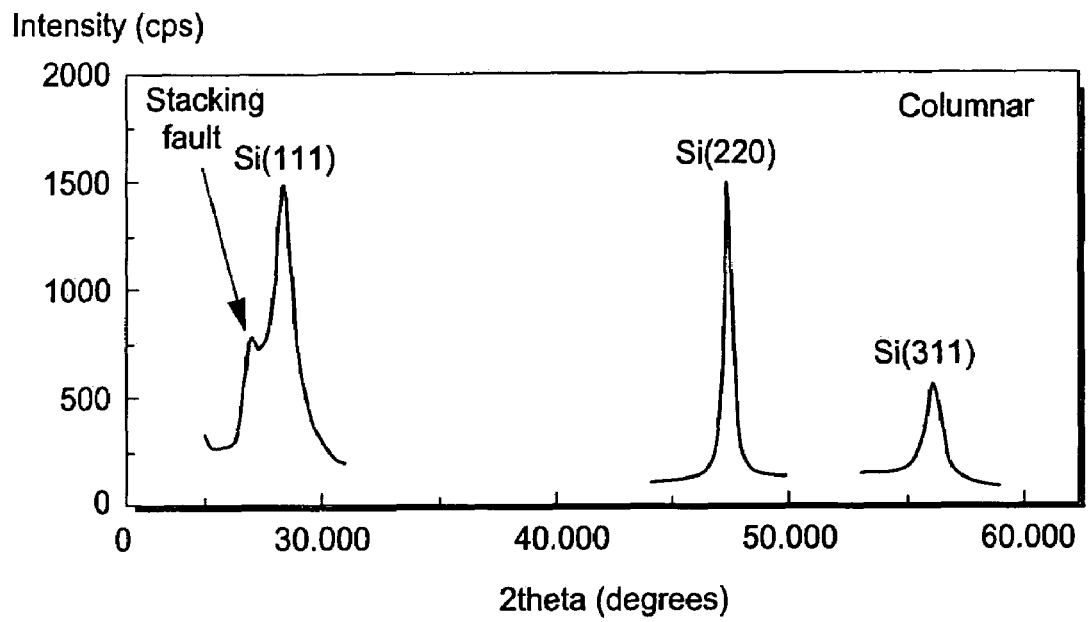
FIG. 8A is a XRD spectrum of a columnar polysilicon layer (prior art).
Figure 8B:
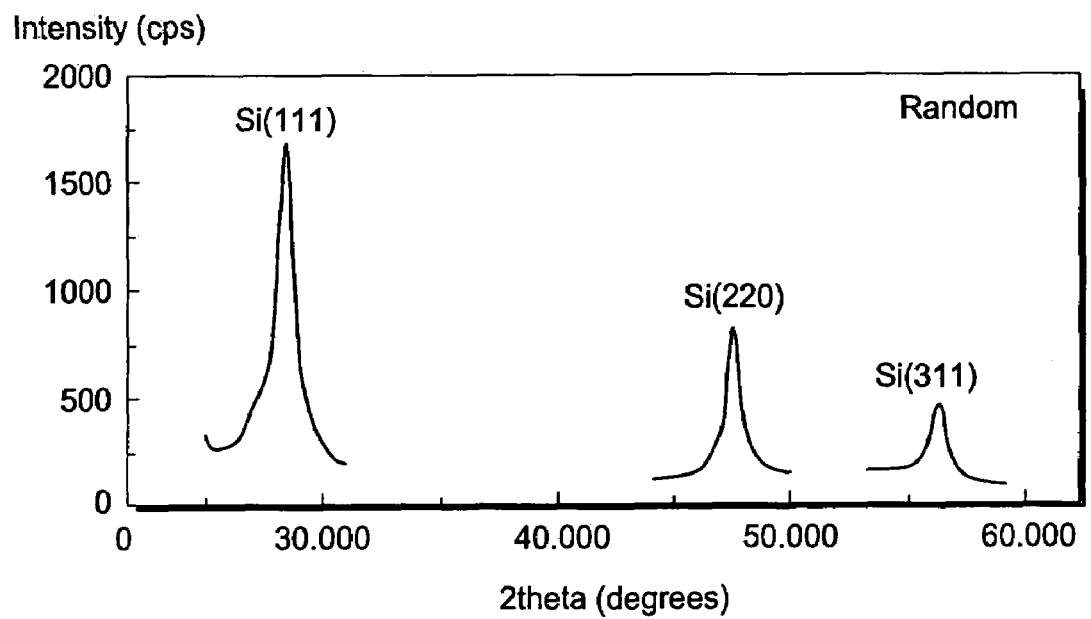
FIG. 8B is a XRD spectrum of a nanocrystalline grain-sized polysilicon layer deposited according to embodiments of the invention.

The peak height ratio of the <111> peak divided by the <220> peak is also a measure of randomness. This ratio should be high, e.g., about 2. As shown in FIGS. 8A and 8B, a polysilicon film having a columnar structure has an XRD spectrum with similar <220> and <111> peaks while a polysilicon film having a random structure has an XRD spectrum with a higher <111> peak. FIGS. 8A and 8B also show that a polysilicon film having a columnar structure may have an asymmetric peak at a diffraction angle 2θ of 27 degrees, which is indicative of a stacking fault, i.e., a deformation of the crystalline lattice, while a random polysilicon film does not have such a peak. The absence of the peak at a diffraction angle 2θ of 27 degrees may be used to provide an initial determination that a polysilicon film is a nanocrystalline grain-sized polysilicon layer. An initial determination that a silicon film is crystalline rather than amorphous can be made by observing <220> and <111> peaks in the XRD spectrum, as amorphous silicon films typically do not have well defined <220> and <111> peaks.

XRD may be also used to determine grain size. The Scherrer equation may be used to measure grain size in the nanocrystalline grain-sized polysilicon layer according the formula:

$$t = \frac{0.9\lambda}{B\cos\theta},$$

where B is the width of the XRD peak at half of the maximum height and t is the grain size. Typically, the maximum grain size of the nanocrystalline grain-sized polysilicon layer before annealing is about 15 nm as measured by XRD and about 30 nm as measured by TEM cross-sectional microscopy. XRD measurements typically underestimate the grain size while TEM measurements overestimate the grain size. The actual grain size is between the values measured by XRD and TEM.

Figure 4:
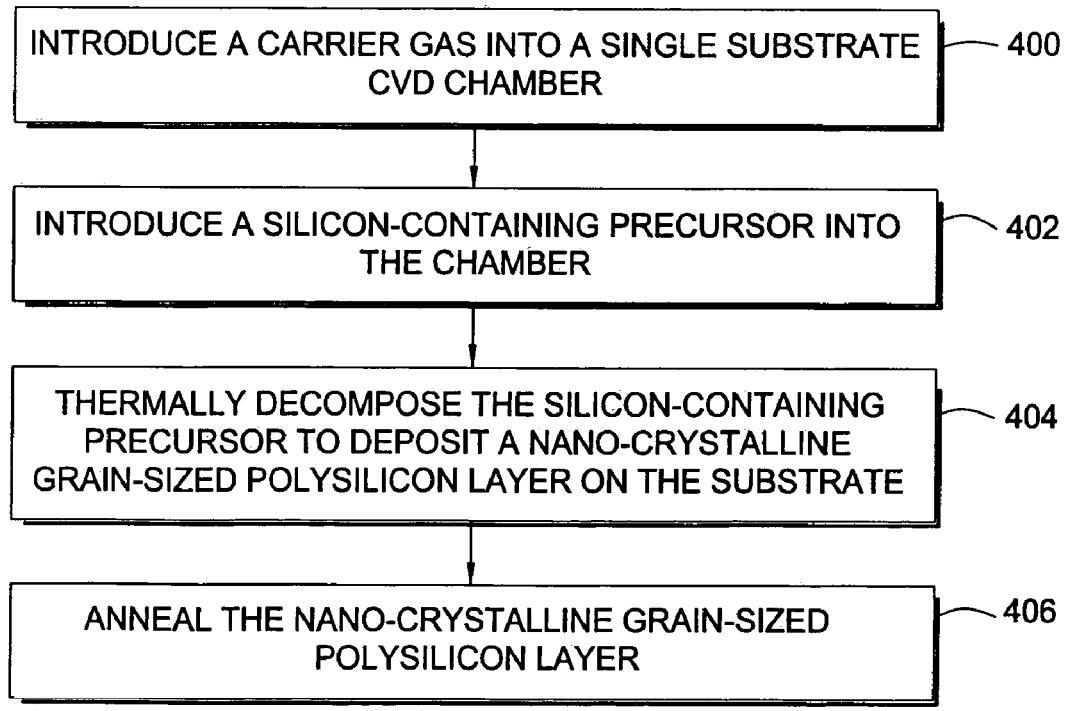
FIG. 4 is a flow chart depicting another embodiment of the invention.

After the nanocrystalline grain-sized polysilicon layer is deposited according to the embodiments of the invention described above, the nanocrystalline grain-sized polysilicon layer may be annealed, as shown in step 406 of FIG. 4. The annealing may be used to activate dopants in the nanocrystalline grain-sized polysilicon layer. The nanocrystalline grain-sized polysilicon layer may be annealed at a substrate support temperature of about 1050° C. for 30 seconds using a rapid thermal anneal chamber, or at a temperature of about 900° C. in a furnace for 30 minutes. The nanocrystalline grain-sized polysilicon layer maintains its grain size, random grain structure, film roughness, film thickness uniformity, and film conformality after annealing. Preferably, the variation in the refractive index of the nanocrystalline grain-sized polysilicon layer across a substrate is less than 0.1.

While the foregoing is directed to embodiments of the present invention, other and further embodiments of the invention may be devised without departing from the basic scope thereof, and the scope thereof is determined by the claims that follow.

What is claimed is:

1. A method of forming a hemispherical grained silicon layer on a substrate, comprising:
   introducing a silicon-containing precursor and a carrier gas into a single substrate chemical vapor deposition chamber; and
   thermally decomposing the silicon-containing precursor to deposit a hemispherical grained silicon layer on the substrate, wherein the substrate is supported on a substrate support in the chamber, the substrate support is maintained at a temperature between about 670° C. and about 710° C., and the chamber is maintained at a pressure between about 100 Torr and about 350 Torr during the deposition.

2. The method of claim 1, wherein the silicon-containing precursor is introduced into the chamber at a rate between about 50 sccm and about 400 sccm and the carrier gas is introduced into the chamber at a rate between about 3000 sccm and about 20000 sccm.

3. The method of claim 1, wherein the silicon-containing precursor is silane or disilane.

4. The method of claim 1, wherein the carrier gas comprises nitrogen ($N_2$).

5. The method of claim 4, wherein the carrier gas further comprises hydrogen ($H_2$).

6. The method of claim 1, wherein the hemispherical grained silicon layer has a refractive index of between about 3.0 and about 3.7.

7. The method of claim 1, wherein the hemispherical grained silicon layer comprises silicon having a grain size between about 450 Å and about 700 Å.

8. The method of claim 1, further comprising doping the hemispherical grained silicon layer.

9. A method of forming a nanocrystalline grain-sized polysilicon layer on a substrate, comprising:
   introducing a silicon-containing precursor and a carrier gas into a single substrate chemical vapor deposition chamber;
   thermally decomposing the silicon-containing precursor to deposit a nanocrystalline grain-sized polysilicon layer on the substrate, wherein the substrate is supported on a substrate support in the chamber, the substrate support is maintained at a temperature between about 700° C. and about 730° C., and the chamber is maintained at a pressure between about 150 Torr and about 350 Torr during the deposition; and
   annealing the nanocrystalline grain-sized polysilicon layer.

10. The method of claim 9, further comprising doping the nanocrystalline grain-sized polysilicon layer during or after the deposition of the nanocrystalline grain-sized polysilicon layer.

11. The method of claim 9, wherein the silicon-containing precursor has a reaction activation energy of less than about 1 eV at a substrate support temperature of less than about 750° C.

12. The method of claim 9, wherein the silicon-containing precursor is disilane and the carrier gas comprises nitrogen ($N_2$) and hydrogen ($H_2$).

13. The method of claim 9, wherein the nanocrystalline grain-sized polysilicon layer comprises silicon having a grain size between about 70 Å and about 120 Å.

14. A method of forming a nanocrystalline grain-sized polysilicon layer on a substrate, comprising:
   introducing a silicon-containing precursor and a carrier gas into a single substrate chemical vapor deposition chamber, wherein the silicon-containing precursor is introduced into the chamber at a first flow rate;
   thermally decomposing the silicon-containing precursor to deposit a first nanocrystalline grain-sized polysilicon layer on the substrate, wherein the substrate is supported on a substrate support in the chamber, the substrate support is maintained at a temperature between about 700° C. and about 730° C., and the chamber is maintained at a pressure between about 150 Torr and about 350 Torr during the deposition; and
   reducing the flow rate of the silicon-containing precursor into the single substrate chemical vapor deposition chamber, and depositing a second nanocrystalline grain-sized polysilicon layer on the first nanocrystalline grain-sized silicon layer.

15. The method of claim 14, further comprising annealing the first and second nanocrystalline grain-sized polysilicon layers.

16. The method of claim 14, further comprising doping the first and second nanocrystalline grain-sized polysilicon layers during or after the deposition of the layers.

17. The method of claim 14, wherein the second nanocrystalline grain sized polysilicon layer has a surface roughness of less than about 3 nm.

18. The method of claim 14, wherein the first flow rate of the silicon-containing precursor is between about 80 sccm and about 200 sccm, and the flow rate of the silicon-containing precursor is reduced to between about 10 sccm and about 70 sccm.

19. The method of claim 14, wherein the nanocrystalline grain-sized polysilicon layers comprise silicon having a grain size between about 70 Å and about 120 Å.

20. The method of claim 14, wherein the silicon-containing precursor is disilane.

* * * * *